United States Patent [19]

Nagai et al.

[11] Patent Number: 4,649,357

[45] Date of Patent: Mar. 10, 1987

[54] SURFACE-ACOUSTIC-WAVE FILTER

[75] Inventors: Kiyoshi Nagai; Nobuyoshi Sakamoto, both of Tokyo, Japan

[73] Assignee: Oki Electric Industry Co., Ltd., Tokyo, Japan

[21] Appl. No.: 832,754

[22] Filed: Feb. 25, 1986

[30] Foreign Application Priority Data

Feb. 25, 1985 [JP] Japan .................................. 60-35993

[51] Int. Cl.$^4$ ....................... H03H 9/64; H03H 9/145
[52] U.S. Cl. ................................. 333/196; 310/313 R; 333/194
[58] Field of Search .................................. 333/150–155, 333/193–196; 310/313 A, 313 B, 313 C, 313 D, 310/313 R; 331/107 A

[56] References Cited

PUBLICATIONS

"Electronics Letters", Nov. 16th, 1972, vol. 8, No. 23, pp. 553–554.

*Primary Examiner*—Marvin L. Nussbaum

*Attorney, Agent, or Firm*—Wenderoth, Lind & Ponack

[57] ABSTRACT

A surface-acoustic-wave filter is of a multi-transducer arrangement including a plurality of input interdigital transducers and a plurality of output interdigital transducers. These input and output transducers are alternately and parallelly disposed on a piezo-electric substrate so as to be spaced intercentral distances $l_1$ through $l_n$ apart. When one of the intercentral distances is a reference distance $l_1$, the respective intercentral distances $l_1$ through $l_n$ satisfies the following relationships:

$$l_1 = m_1 \cdot \lambda, \; l_2 = l_1 + m_2 \cdot \lambda, \; l_3 = l_1 + m_3 \cdot \lambda \ldots$$
$$l_n = l_1 + m_n \cdot \lambda$$

where $m_1$ is an arbitrary positive real number, $m_2$ through $m_n$ are respectively arbitrary integers $(0, \pm 1, \pm 2, \ldots)$, and $\lambda$ is a wavelength of the surface-acoustic-wave. The surface-acoustic-wave filter provides a good filter characteristic having sufficient effective attenuation in the attenuation region without deteriorating the filter characteristic in a pass-band thereof.

4 Claims, 9 Drawing Figures

SURFACE-ACOUSTIC-WAVE FILTER

BACKGROUND OF THE INVENTION

1. Field of the Invention

The present invention relates to a surface-acoustic-wave filter, and more particularly to a multi-transducer surface-acoustic-wave filter for providing a good filter characteristic capable of assuring a sufficient effective attenuation in an attenuation region but without deteriorating the filter characteristics in a pass band thereof. The surface-acoustic-wave filter is applicable to a bandpass filter in HF, VHF, and/or UHF bands.

2. Description of the Prior Art

Various types of surface-acoustic-wave filters have been proposed and put to practice up to now. FIG. 1 is a schematic plan view of a prior surface-acoustic-wave filter having two transducers (hereinafter referred to as a two-transducer filter), wherein each transducer is of an interdigital type which has interdigital electrodes. Element 1 is a piezo-electric substrate; element 2 is an input transducer; element 3 is an output transducer; element 4 is an input terminal; element 5 is an output terminal, and elements 6 and 7 are respectively surface-acoustic waves transduced in response to an input signal through the input transducer 2 and delivered.

Since the transducer is bidirectional in general, an electrical signal supplied to the input terminal 4 is transduced through the input transducer 2 equally with respect to two surface-acoustic-waves propagating in two opposite directions. The output transducer 3 accordingly receives only the surface-acoustic-wave propagating in one direction, i.e.—it receives ½ of the supplied electrical signal, whereas it delivers from the output terminal 5 only ½ of the received signal, i.e.—only ¼ of the supplied electrical signal. It is accordingly known that a two-transducer type filter has an insertion loss of 6 dB, even if it is ideal.

To reduce the insertion loss of such a surface-acoustic-wave as described above, a surface-acoustic-wave filter, named a multi-transducer filter, has been proposed for use in various applications up to now.

The filter, as shown in FIG. 2, for example, comprises a structure such that a plurality of input and output transducers (five transducers in the illustrated case) 2 and 3 are alternately and equally spaced on the piezoelectrical substrate 1. The illustrated five-transducer filter is constructed such that the input transducer 2 transforms a supplied electrical signal into surface-acoustic-waves which are then received by a plurality of output transducers 3 whereby the energy of the surface-acoustic-waves which are not transformed into output signals due to their leakage to the outside of the surface-acoustic-wave filter and due to other reasons, can be reduced. The insertion loss of this type of filter can be further decreased as a number of the transducers is increased.

FIG. 3 shows a loss (dB) versus frequency characteristic of the five-transducer filter and that of the previously described two-transducer filter where fo is a center frequency thereof. It is evidenced from FIG. 3 that, in contrast with the two-transducer filter (as shown by a broken line I), the five-transducer filter (as shown by a solid line II), although being advantageous in a fact that the loss in the pass band is reduced, has drawbacks in that the loss in the attenuation region is sharply decreased and so as a difference between the minimum loss in the attenuation region and the maximum loss in the pass-band, that is, the effective attenuation, is reduced.

For example, the effective attenuations of the five-, seven-, and nine-transducer filters are respectively deteriorated by about 10, 15, and 20 dB as compared with that of the two-transducer filter.

The reason is as follows. Since a conventional multi-transducer filter has, as shown in FIG. 2, intercentral distances between the center of adjoining respective input and output transducers (i.e.—the propagation distances of a surface-acoustic-wave through the transducers) spaced in an equal interval l(i.e.—constant), electrical signals simultaneously applied thereto and delivered from the respective output transducers have the same phase in a certain frequency interval. Therefore, a gain of the multi-transducer filter in the attenuation frequency region has sharp peaks in a frequency period of V/2 l (where V is a propagation velocity of the surface-acoustic-wave).

FIG. 4 shows the filter characteristic, wherein the frequencies and gains (dB) are respectively plotted on the abscissa and ordinate axes, and wherein fo is a center frequency. As shown in the figures, the whole characteristic of the multi-transducer filter is deteriorated in its effective attenuation.

SUMMARY OF THE INVENTION

In view of the drawbacks with the conventional surface-acoustic-wave filter, it is an object of the present invention to provide a multi-transducer surface-acoustic-wave filter capable of providing an excellent filter characteristic having sufficient effective attenuation in the attenuation frequency region by preventing loss in the same region from being sharply lowered without deteriorating the filter characteristic in a pass band thereof.

To achieve the above object, a surface-acoustic-wave filter according to the present invention, for converting an electrical signal into a surface acoustic wave and vice versa, has a substrate through which a surface-acoustic-wave propagates, and a plurality of input and output transducers comprising a plurality of surface-acoustic-wave transducers formed on the substrate, where each transducer is of an interdigital type which has interdigital electrodes. The input transducers and the output transducers are alternately disposed in the propagation direction of the surface-acoustic-wave, and, when an intercentral distance between the center of any mutually adjoining surface-acoustic-wave transducers is a reference distance $l_1$, i.e.—when an intercentral distance from the center of an input transducer to the center of an adjoining output transducer is a propagation distance $l_1$ of a surface acoustic wave, and when the other intercentral distances between mutually adjoining surface-acoustic-wave transducers other than the reference distance $l_1$ are respectively $l_2$ through $l_n$, the following relationships hold:

$$l_1 = m_1 \cdot \lambda$$
$$l_2 = l_1 + m_n \cdot \lambda$$
$$\vdots$$
$$l_n = l_1 + m_n \cdot \lambda$$

where

λ is a wavelength of the surface-acoustic-wave and defined by $\lambda = V/fo$ when V is a propagation velocity of the surface-acoustic-wave, and the center frequency of the surface-acoustic-wave filter is fo, and $m_1$ is an arbitrary positive real number, and $m_2$ through $m_n$ are respectively arbitrary integers (0, ±1, ±2, ...), and at least one distance from among the respective distances $l_1$-$l_n$ is different from the other remaining distances. In addition, in the above, arrangement, the respective intercentral distances $l_1$-$l_n$ between the centers of the mutually adjoining surface-acoustic-wave transducers may be partly or wholly different from each other and the reference distance $l_1$ may be an integral multiple of the wavelength.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of a surface-acoustic-wave filter according to the present invention will be described with reference to FIG. 5.

Figure 1:
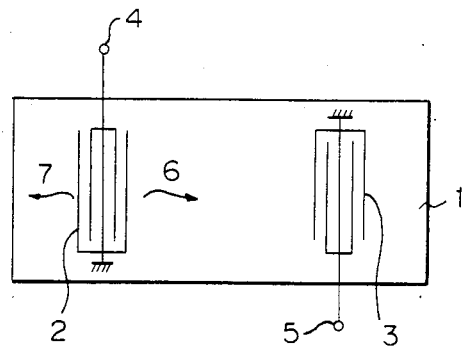
FIG. 1 is a schematic plan view showing a prior art two-transducer surface-acoustic-wave filter.
Figure 2:
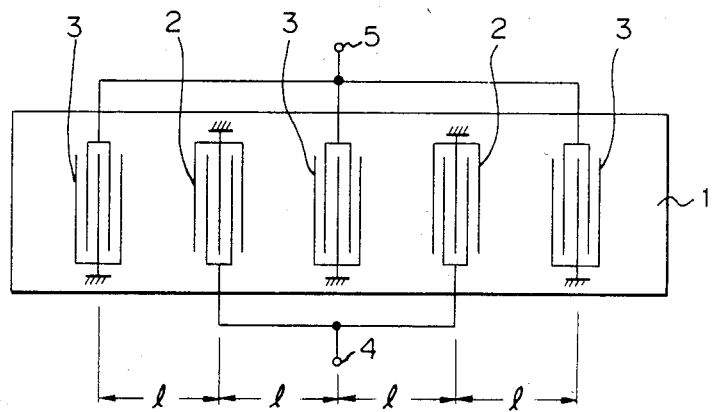
FIG. 2 is a schematic plan view showing a prior art five-transducer surface-acoustic-wave filter.
Figure 3:
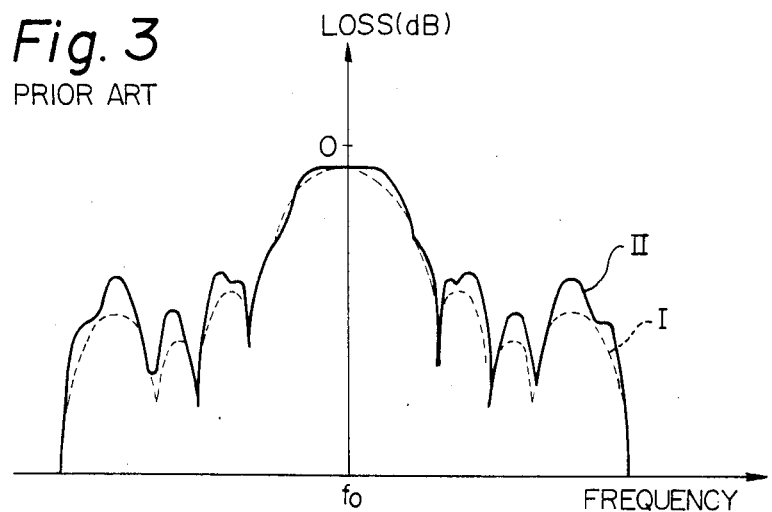
FIG. 3 is a view illustrating a filter characteristic of a prior art filter.
Figure 4:
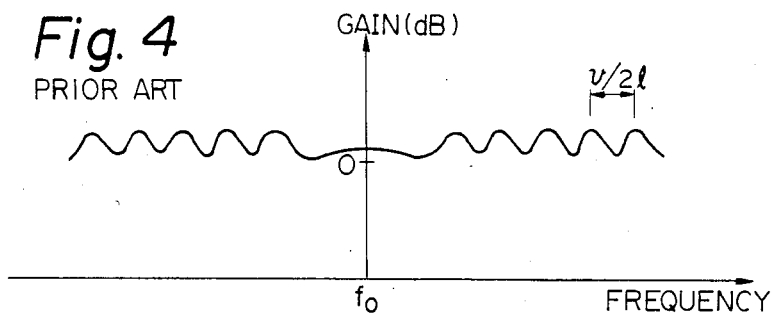
FIG. 4 is a view illustrating a frequency versus gain characteristic of a prior art filter.
Figure 5:
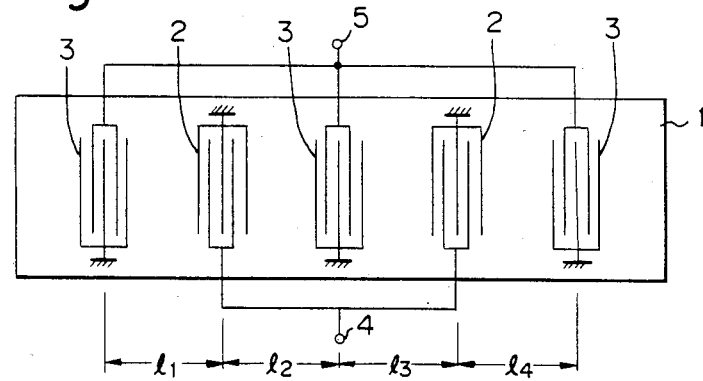
FIG. 5 is a schematic plan view illustrating an embodiment of a surface-acoustic-wave filter according to the present invention.

The surface-acoustic-wave filter shown in FIG. 5 is a five-transducer filter having input and output transducers 2 and 3 each comprising surface-acoustic-wave interdigital transducer alternately disposed in the propagation direction of a surface-acoustic-wave, and includes input and output terminals 4 and 5. As shown in FIG. 5, the output and input 3 and 2 are disposed successively and alternately such that the intercentral distances between the center of the respective adjoining transducers are equal to $l_1$, $l_2$, $l_3$, and $l_4$. Any one of these distances $l_1$, $l_2$, $l_3$, and $l_4$ provides the reference distance. Here, the distance $l_1$ for example is assumed to be the reference distance. A part or all of the remaining other distances $l_2$, $l_3$, and $l_4$ are assumed to be different from the reference distance $l_1$ by an integral multiple (0, ±1, ±2, ±3, ...) of the wavelength λ of the surface-acoustic-wave at the center frequency of the surface-acoustic-wave filter. For example, relationship of $l_1 = m_1 \cdot \lambda$, $l_2 = l_1 + m_2 \cdot \lambda$, $l_3 = l_1 + m_3 \cdot \lambda$ and $l_4 = l_1 + m_4 \cdot \lambda$ are given. Here λ is a wavelength of a surface-acoustic-wave given by a ratio of a propagation velocity V of the surface-acoustic-wave to a center frequency fo thereof, i.e., $\lambda = V/fo$. $m_1$ is an arbitrary positive real number, and $m_2$ through $m_4$ are respectively arbitrary integers (0, ±1, ±2, ±3, ...). As described above, with the arrangement of the surface-acoustic-wave transducer, a part or the whole of the respective intercentral distances $l_1$, $l_2$, $l_3$, $l_4$ are made to be different from each other by an integral multiple wavelength λ.

Figure 6:
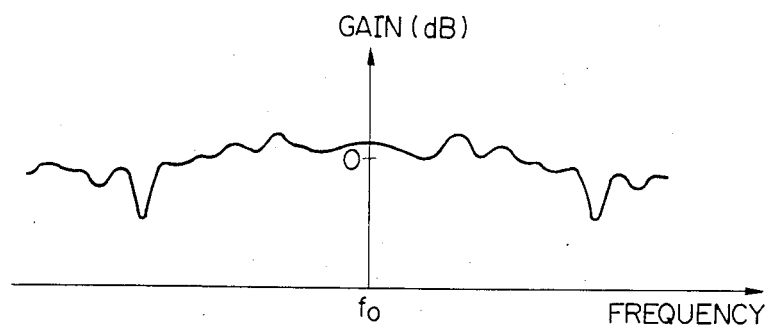
FIG. 6 is a view showing a frequency versus gain characteristic of the filter of FIG. 5.

The respective transducers in the present invention are arranged so as to satisfy intercentral distances of $l_1 = 20.5$, $l_2 = l_1 + 2\lambda$, $l_3 = l_1 + 4\lambda$ and $l_4 = l_1 + 6\lambda$. As a result of it, propagation distances of surface-acoustic-waves between the respective transducers become uneven, and electrical signals delivered from the respective transducers 3 differ from each other in their phases. Accordingly, it is obvious from the frequency versus gain characteristic shown in FIG. 6 that the filter is prevented from having sharp gain in the attenuation region, whereby an electrical signal in the attenuation region is more intensely reduced.

Figure 7:
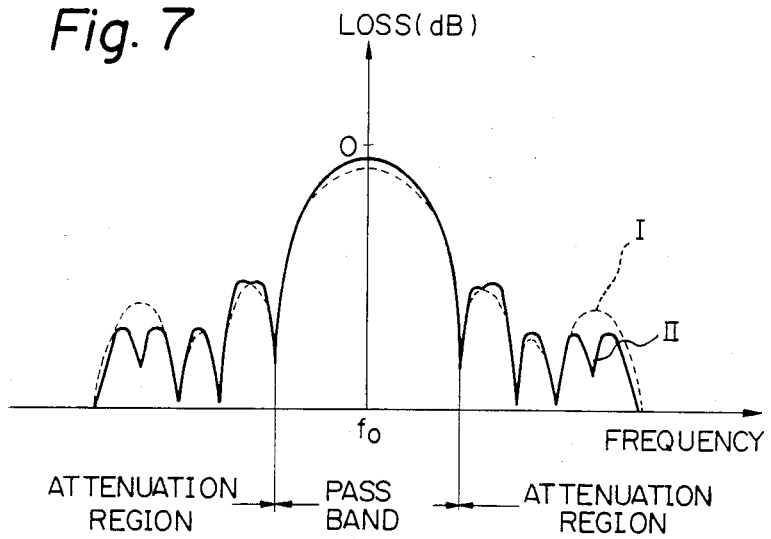
FIG. 7 is a view showing a filter characteristic of the filter of FIG. 5 and a filter characteristic of a prior art filter.

As evidenced from FIG. 7 showing the filter characteristics of the five-transducer filters of FIG. 5 and the prior art two-transducer filter, the effective attenuation of an electrical signal through the five-transducer filter (shown by a solid line II) is larger than that of the two-transducer filter (shown by a broken line I).

Although the intercentral distances between the centers of the respective transducers are described as $l_1 = 20.5$, $l_2 = l_1 + 2\lambda$, $l_3 = l_1 + 4\lambda$ and $l_4 = l_1 + 6\lambda$ in the present embodiment, those intercentral distances between the centers of the adjoining respective transducers may be properly altered in their design in response to a filter characteristic desired by the two-transducer filter and so as to reduce the losses of an electrical signal passing therethrough. In addition, although in the above embodiment, the reference distance is given as $l_1 = 20.5\lambda$, $m_1$ may of course be an integer such as $m_1 = 20$. For example, assuming $m_1 = 20$, the reference distance $l_1 = 20\lambda$.

Another embodiment of the surface-acoustic-wave filter according to the present invention will be described with reference to FIG. 8.

Figure 8:
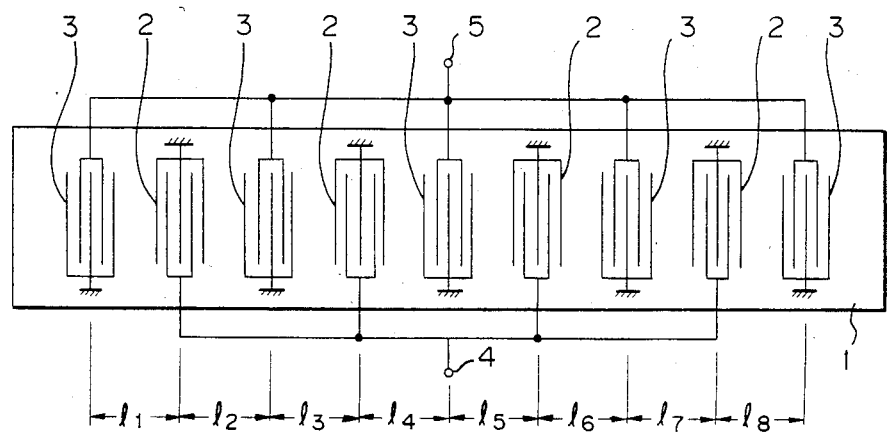
FIG. 8 is a schematic plan view illustrating another embodiment of the surface-acoustic-wave filter according to the present invention.

The surface-acoustic-wave filter shown in FIG. 8 is of a nine-transducer type in which the output transducers 3 and the input transducers 2 are successively and alternately disposed on the piezo-electric substrate 1 respectively spaced apart at intercentral distances of $l_1$, $l_2$, $l_3$, $l_4$, $l_5$, $l_6$, $l_7$, and $l_8$. Any one of these distances $l_1$ through $l_8$ may be the reference distance. Here, the distance $l_1$ is for example assumed to be the reference distance, while a part or all of the other remaining distances $l_2$ through $l_8$ are made to differ from each other by an integral multiple (0, ±1, ±2, ±3, ...) of the wavelength of the surface-acoustic-wave at the center frequency thereof with respect to the reference distance $l_1$. The present embodiment set these intercentral distances to $l_1 = 20.5\lambda$, $l_2 = l_1 + \lambda$, $l_3 = l_1 + 2\lambda$, $l_4 = l_1 + 3\lambda$, $l_5 = l_1 + 4\lambda$, $l_6 = l_1 + 5\lambda$, $l_7 - l_1 + 6\lambda$, and $l_8 = l_1 + 7\lambda$.

Figure 9:
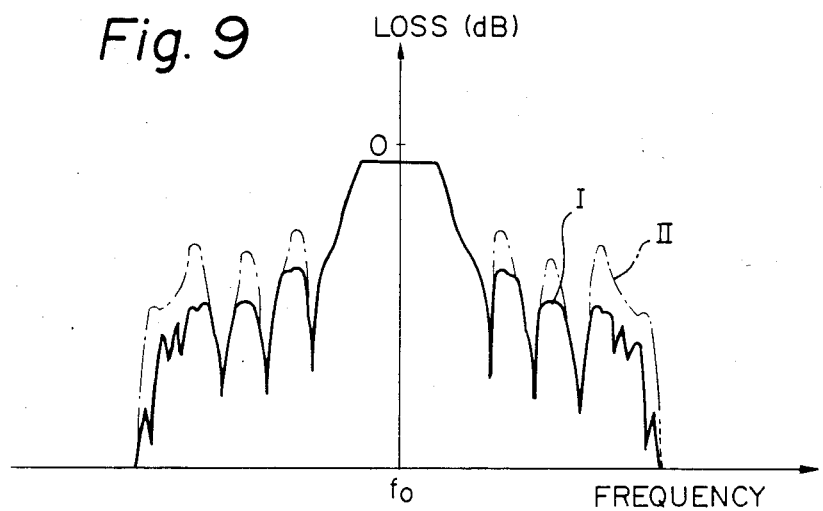
FIG. 9 is a view showing a filter characteristic of the filter of FIG. 8 and that of a prior art filter.

As evidenced from FIG. 9 showing the filter characteristics of a prior art nine-transducer filter (shown by a dashed and dotted chain line II) having its intercentral distances $l_1$ through $l_8$ all made equal and of the nine-transducer filter according to the present invention (shown by a solid line I), as the number of transducers constituting the filter is increased, the filter characteristic in the attenuation region is further sharpened and thus deteriorated in the case of the prior nine-transducer filter.

However, the nine-transducer filter according to the present invention, although having the same number of transducers, does not have its effective attenuation deteriorated and the filter characteristic thereof is clearly improved as compared with the prior art nine-transducer filter characteristics.

The intercentral distances $l_1$ through $l_8$ of the nine-transducer filter according to the present invention may be wholly or partly charged and properly set, whereby a more excellent filter can be achieved. The reference distance $l_1$ can also be made to an integral multiple of the wavelength $\lambda$ in the present embodiment.

Although the above specific embodiments describe surface-acoustic-wave filters of five- and nine-transducer structures, it goes without saying that the present invention may include other multi-transducer surface-acoustic-wave filters besides those described above.

According to the present invention, as described above, the multi-transducer surface-acoustic-wave filter is composed of a plurality of the surface-acoustic-wave transducers arranged such that the phases of electrical signals from the respective output transducers can be shifted in the attenuation region.

The multi-transducer filters according to the present invention can prevent sharp gains from being provided in the attenuation region without deteriorating the passband characteristic thereof and minimizes reductions of the attenuation in the same region.

Accordingly, the multi-transducer filter according to the present invention can provide a surface-acoustic-wave filter having a good filter characteristic with sufficient attenuation and with reduced loss.

Although certain preferred embodiments have been shown and described, it should be understood that many changes and modifications may be made therein without departing from the scope of the appended claims.

What is claimed is:

1. A surface-acoustic-wave filter comprising a substrate through which a surface-acoustic-wave propagates, and input transducers and output transducers each composed of a plurality of surface-acoustic-wave interdigital transducers, for converting an electrical signal into a surface acoustic wave and vice versa, formed on said substrate, said input transducers and said output transducers being alternately disposed in the propagation direction of the surface-acoustic-wave;

wherein said surface-acoustic-wave interdigital transducers are disposed such that, when an intercentral distance between the centers of two mutually adjoining surface-acoustic-wave interdigital transducers is a reference distance $l_1$ and when the other intercentral distances between the centers of the mutually adjoining respective surface-acoustic-wave interdigital transducers besides said reference distance $l_1$, are $l_2$ through $l_n$ respectively, the following equations are satisfied:

$$l_1 = m_1 \cdot \lambda$$
$$l_2 = l_1 + m_n \cdot \lambda$$
$$\vdots$$
$$l_n = l_1 + m_n \cdot \lambda$$

wherein $\lambda$ is a wavelength of the surface-acoustic-wave and is defined by $\lambda = V/fo$ when the propagation velocity of the surface-acoustic-wave is V and a center frequency of the surface-acoustic-wave filter is fo, and $m_1$ is an arbitrary positive real number, and $m_2$ through $m_n$ are respectively arbitrary integers, and said surface-acoustic-wave interdigital transducers are arranged such that at least one distance selected from among said respective distances $l_1$ through $l_n$ differs from the other remaining distances.

2. A surface-acoustic-wave filter according to claim 1, wherein said respective intercentral distances $l_1$ through $l_n$ between the centers of said mutually adjoining surface-acoustic-wave interdigital transducers differ partly or wholly from each other.

3. A surface-acoustic-wave filter according to claim 1, wherein said reference distance $l_1$ is an integral multiple of the wavelength $\lambda$ of the surface-acoustic-wave.

4. A surface-acoustic-wave filter according to claim 2, wherein said reference distance $l_1$ is an integral multiple of the wavelength $\lambda$ of the surface-acoustic-wave.

* * * * *

UNITED STATES PATENT AND TRADEMARK OFFICE
CERTIFICATE OF CORRECTION

PATENT NO. : 4,649,357
DATED : March 10, 1987
INVENTOR(S) : Kiyoshi NAGAI and Nobuyoshi SAKAMOTO It is certified that error appears in the above-identified patent and that said Letters Patent is hereby corrected as shown below:

Column 2, in the equation, line 2 thereof, change "$m_n$" to --$m_2$--;

Column 6 (Claim 1), in the equation, line 2 thereof, change "$m_n$" to --$m_2$--.

Signed and Sealed this

Thirty-first Day of May, 1988

*Attest:*

DONALD J. QUIGG

*Attesting Officer*  *Commissioner of Patents and Trademarks*